United States Patent
Venkatasubramanian et al.

(10) Patent No.: US 11,430,655 B2
(45) Date of Patent: *Aug. 30, 2022

(54) LOW TEMPERATURE HIGH-QUALITY DIELECTRIC FILMS

(71) Applicant: Applied Materials, Inc., Santa Clara, CA (US)

(72) Inventors: Eswaranand Venkatasubramanian, Santa Clara, CA (US); Samuel E. Gottheim, Santa Clara, CA (US); Pramit Manna, Sunnyvale, CA (US); Abhijit Basu Mallick, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 115 days.

This patent is subject to a terminal disclaimer.

(21) Appl. No.: 17/069,008

(22) Filed: Oct. 13, 2020

(65) Prior Publication Data

US 2021/0043450 A1     Feb. 11, 2021

Related U.S. Application Data

(63) Continuation of application No. 16/511,081, filed on Jul. 15, 2019, now Pat. No. 10,840,088.

(Continued)

(51) Int. Cl.
*H01L 21/00* (2006.01)
*H01J 37/32* (2006.01)
(Continued)

(52) U.S. Cl.
CPC .. *H01L 21/02274* (2013.01); *H01J 37/32082* (2013.01); *H01J 37/32715* (2013.01);
(Continued)

(58) Field of Classification Search
CPC ......... H01L 21/02126; H01L 21/02274; H01L 21/0214; H01L 21/02205; H01L 21/67103;
(Continued)

(56) References Cited

U.S. PATENT DOCUMENTS 5,661,093 A     8/1997  Ravi et al.
6,709,714 B2 *  3/2004  Lin ................... C08G 73/00
                                              264/456

(Continued)

FOREIGN PATENT DOCUMENTS

JP     2009071293 A    4/2009
JP     2012089694 A    5/2012

OTHER PUBLICATIONS

PCT International Search Report and Written Opinion in PCT/US2019/041781 dated Oct. 31, 2019, 13 pages.

(Continued)

*Primary Examiner* — Nikolay K Yushin
(74) *Attorney, Agent, or Firm* — Servilla Whitney LLC

(57) ABSTRACT

Techniques for deposition of high-density dielectric films for patterning applications are described. More particularly, a method of processing a substrate is provided. The method includes flowing a precursor-containing gas mixture into a processing volume of a processing chamber having a substrate positioned on an electrostatic chuck. The substrate is maintained at a pressure between about 0.1 mTorr and about 10 Torr. A plasma is generated at the substrate level by applying a first RF bias to the electrostatic chuck to deposit a dielectric film on the substrate. The dielectric film has a refractive index in a range of about 1.5 to about 3.

20 Claims, 5 Drawing Sheets

Related U.S. Application Data

(60) Provisional application No. 62/700,482, filed on Jul. 19, 2018.

(51) Int. Cl.
*H01L 21/02* (2006.01)
*H01L 21/311* (2006.01)
*H01L 21/683* (2006.01)

(52) U.S. Cl.
CPC .... *H01J 37/32816* (2013.01); *H01L 21/0214* (2013.01); *H01L 21/0217* (2013.01); *H01L 21/02123* (2013.01); *H01L 21/02126* (2013.01); *H01L 21/02164* (2013.01); *H01L 21/02167* (2013.01); *H01L 21/02186* (2013.01); *H01L 21/02205* (2013.01); *H01L 21/02208* (2013.01); *H01L 21/02211* (2013.01); *H01L 21/31144* (2013.01); *H01J 2237/332* (2013.01); *H01L 21/6831* (2013.01)

(58) Field of Classification Search
CPC ........... H01L 21/0217; H01L 21/02164; H01L 21/31144; H01L 21/0276; H01L 21/02211; H01L 21/02186; H01L 21/02208; H01L 21/02167; H01L 21/6831; H01J 37/32082; H01J 37/32715; H01J 37/32816; H01J 2237/332; H01J 2237/3321; H01J 2237/3328; H01J 2237/5253

See application file for complete search history.

(56) References Cited

U.S. PATENT DOCUMENTS

| | | | |
|---|---|---|---|
| 7,223,676 B2 | 5/2007 | Hanawa et al. | |
| 7,611,758 B2 | 11/2009 | Fukiage et al. | |
| 9,018,108 B2 * | 4/2015 | Hong | H01L 21/02126 438/778 |
| 2003/0008069 A1 | 1/2003 | Nemani et al. | |
| 2004/0200417 A1 | 10/2004 | Hanawa et al. | |
| 2011/0096461 A1 | 4/2011 | Yoshikawa et al. | |

OTHER PUBLICATIONS

Die, et al., "Measurement of Optical Constants of TiN and TiN/Ti/TiN Multilayer Films for Microwave Kinetic Inductance Photon-Number Resolving Detectors", of Low Temperature Physics (2019), vol. 194; pp. 361-369 Published online: Dec. 18, 2018 (Year: 2018), 2019.

* cited by examiner

LOW TEMPERATURE HIGH-QUALITY DIELECTRIC FILMS

CROSS-REFERENCE TO RELATED APPLICATIONS

This application is a continuation of U.S. application Ser. No. 16/511,081, filed Jul. 15, 2019, which claims priority to U.S. Provisional Application Ser. No. 62/700,482, filed Jul. 19, 2018, the entire disclosures of which are hereby incorporated by reference herein.

TECHNICAL FIELD

Embodiments of the present disclosure pertain to the field of electronic device manufacturing, and in particular, to integrated circuit (IC) manufacturing. More particularly, embodiments of the disclosure provide methods of depositing dielectric films, which can be used for patterning applications.

BACKGROUND

Integrated circuits have evolved into complex devices that can include millions of transistors, capacitors, and resistors on a single chip. The evolution of chip designs continually requires faster circuitry and greater circuit density. The demands for faster circuits with greater circuit densities impose corresponding demands on the materials used to fabricate such integrated circuits. In particular, as the dimensions of integrated circuit components are reduced, it is necessary to use low resistivity conductive materials as well as low dielectric constant insulating materials to obtain suitable electrical performance from such components.

The demands for greater integrated circuit densities also impose demands on the process sequences used in the manufacture of integrated circuit components. For example, in process sequences that use conventional photolithographic techniques, a layer of energy sensitive resist is formed over a stack of material layers disposed on a substrate. The energy sensitive resist layer is exposed to an image of a pattern to form a photoresist mask. Thereafter, the mask pattern is transferred to one or more of the material layers of the stack using an etch process. The chemical etchant used in the etch process is selected to have a greater etch selectivity for the material layers of the stack than for the mask of energy sensitive resist. That is, the chemical etchant etches the one or more layers of the material stack at a rate much faster than the energy sensitive resist. The etch selectivity to the one or more material layers of the stack over the resist prevents the energy sensitive resist from being consumed prior to completion of the pattern transfer.

As the pattern dimensions are reduced, the thickness of the energy sensitive resist must correspondingly be reduced in order to control pattern resolution. Many of the new applications in the industry have a very low thermal budget, below 400° C. (e.g. cross-point memory flow). Thus, there is a need for depositing high quality dielectric films for patterning and other applications that meet this stringent thermal budget without sacrificing film quality.

SUMMARY

Apparatuses and methods to manufacture integrated circuits are described. In one or more embodiments, a method of forming film on a substrate is described. In one embodiment, a film is formed on a substrate by flowing a precursor-containing gas mixture into a processing volume of a processing chamber having a substrate positioned on an electrostatic chuck. The substrate is maintained at a pressure in a range of about 0.1 mTorr and about 10 Torr and at a temperature in a range of about −50° C. to about 150° C. A plasma is generated at the substrate level by applying a first RF bias to the electrostatic chuck to deposit a dielectric film on the substrate, the dielectric film having a refractive index in a range of about 1.5 to about 3.

In one or more embodiments, a method of forming film on a substrate is described. In one embodiment, a film is formed on a substrate by flowing a precursor-containing gas mixture into a processing volume of a processing chamber having as substrate positioned on an electrostatic chuck, wherein the precursor-containing gas mixture comprises one or more precursor selected from silane ($SiH_4$), triethoxysilane ($SiH(OEt)_3$), tetraethoxysilane (tetraethyl orthosilicate; $Si(OEt)_4$ or TEOS), disilane ($Si_2H_6$), $SiH(CH_3)_3$, dimethylsilane ($SiH_2(CH_3)_2$), methylsilane ($SiH_3CH_3$), dichlorosilane ($SiH_2Cl_2$), silicon tetrachloride ($SiCl_4$), silicon tetrafluoride ($SiF_4$), trichlorosilane ($HSiCl_3$), methylsilane ($CH_3SiH_3$), trimethylsilane ($C_3H_{10}Si$), 1,1,3,3-tetramethyldisiloxane (TMDZ), 1,3,5-trisilapentane (TSP), (bis(tertiarybutylamino)silane (BTBAS), (bis(diethylamino)silane (BDEAS), tris(dimethylamino)silane (TDMAS), (Si[N(tBu)CH=CHN(tBu)](OEt)$_2$ (Si-TBES), Si[N(tBu)CH=CHN(tBu)](H)NH$_2$ (Si-TBAS), germane ($GeH_4$), germanium tetrachloride ($GeCl_4$), germanium tetrafluoride ($GeF_4$), t-butylgermane ($GeH(CH_3)_3$), $N_2O$, $O_2$, $NH_3$, $N_2$, $H_2$, $C_2H_2$, or $C_3H_6$. The substrate is maintained at a pressure in a range of about 0.1 mTorr to about 10 Torr. A plasma is generated at the substrate level by applying a first RF bias and a second RF bias to the electrostatic chuck to deposit a dielectric film on the substrate, the dielectric film having a refractive index in a range of about 1.5 to about 3.

In one or more embodiments, a method of forming film on a substrate is described. In one embodiment, a film is formed on a substrate flowing a precursor-containing gas mixture into a processing volume of a process chamber having a substrate positioned on an electrostatic chuck. The processing volume is maintained at a pressure in a range of about 0.1 mTorr to about 10 Torr. A plasma is generated at the substrate level by applying a first RF bias and a second RF bias to the electrostatic chuck to deposit a dielectric film on the substrate, the dielectric film having a refractive index in a range of about 1.5 to about 3. A patterned photoresist layer is formed over the dielectric film. The dielectric film is etched in a pattern corresponding with the patterned photoresist layer. The pattern is etched into the substrate. A material is deposited into the etched portions of the dielectric film.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

DETAILED DESCRIPTION

Figure 1A:
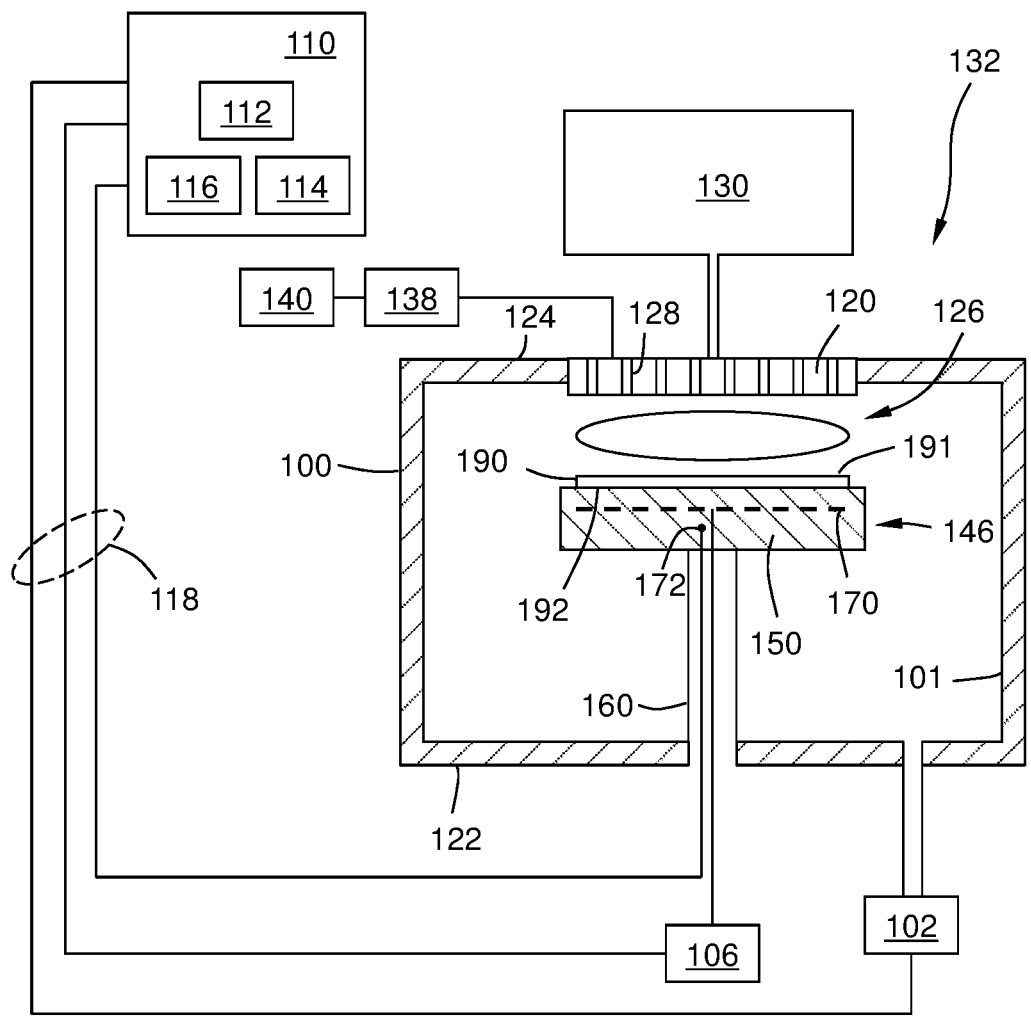
FIG. 1A illustrates a schematic cross-sectional view of a deposition system that can be used for the practice of embodiments described herein.

Before describing several exemplary embodiments of the disclosure, it is to be understood that the disclosure is not limited to the details of construction or process steps set forth in the following description. The disclosure is capable of other embodiments and of being practiced or being carried out in various ways.

Many of the details, dimensions, angles and other features shown in the Figures are merely illustrative of particular embodiments. Accordingly, other embodiments can have other details, components, dimensions, angles and features without departing from the spirit or scope of the present disclosure. In addition, further embodiments of the disclosure can be practiced without several of the details described below.

A "substrate", "substrate surface", or the like, as used herein, refers to any substrate or material surface formed on a substrate upon which processing is performed. For example, a substrate surface on which processing can be performed include, but are not limited to, materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate (or otherwise generate or graft target chemical moieties to impart chemical functionality), anneal and/or bake the substrate surface. In addition to processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface. What a given substrate surface comprises will depend on what materials are to be deposited, as well as the particular chemistry used.

As used in this specification and the appended claims, the terms "reactive compound," "reactive gas," "reactive species," "precursor," "process gas," and the like are used interchangeably to mean a substance with a species capable of reacting with the substrate surface or material on the substrate surface in a surface reaction (e.g., chemisorption, oxidation, reduction). For example, a first "reactive gas" may simply adsorb onto the surface of a substrate and be available for further chemical reaction with a second reactive gas.

As used in this specification and the appended claims, the terms "precursor", "reactant", "reactive gas" and the like are used interchangeably to refer to any gaseous species that can react with the substrate surface.

As used herein, "chemical vapor deposition" refers to a process in which a substrate surface is exposed to precursors and/or co-reagents simultaneous or substantially simultaneously. As used herein, "substantially simultaneously" refers to either co-flow or where there is overlap for a majority of exposures of the precursors.

Plasma enhanced chemical vapor deposition (PECVD) is widely used to deposit films due to cost efficiency and film property versatility. In a PECVD process, a hydrocarbon source, such as a gas-phase hydrocarbon or a vapor of a liquid-phase hydrocarbon that have been entrained in a carrier gas, is introduced into a PECVD chamber. A plasma-initiated gas, typically helium, is also introduced into the chamber. Plasma is then initiated in the chamber to create excited CH-radicals. The excited CH-radicals are chemically bound to the surface of a substrate positioned in the chamber, forming the desired amorphous carbon film thereon. Embodiments described herein in reference to a PECVD process can be carried out using any suitable thin film deposition system. Any apparatus description described herein is illustrative and should not be construed or interpreted as limiting the scope of the embodiments described herein.

Many applications in the semiconductor industry have very low thermal budget less than 400° C., even less than 300° C. in some circumstance. Typically, in a PECVD process, film quality is compromised greatly at low temperatures. Embodiments described herein advantageously provide methods for depositing high quality dielectric films for patterning and other applications that meet this stringent thermal budget without sacrificing film quality.

Embodiments described herein, include improved methods of fabricating dielectric films with high-density (e.g., >1.8 g/cc), high refractive index (e.g., >1.5) and low stress (e.g., <−500 MPa). In one or more embodiments, the density and stress are dependent upon the specific film fabricated, but the films of one or more embodiments have similar or improved densities and stress when compared to films fabricated at much higher temperatures. The dielectric films fabricated according to the embodiments described herein are amorphous in nature and have a higher etch selectivity with much greater density (e.g. >1.8 g/cc) along with lower stress (<−500 MPa) than current patterning films. In general, the deposition process described herein is also fully compatible with current integration schemes for hardmask applications.

In some embodiments, the dielectric films described herein may be formed by chemical vapor deposition (plasma enhanced and/or thermal) processes using precursor-containing gas mixtures including one or more precursor selected from silane ($SiH_4$), triethoxysilane ($SiH(OEt)_3$), tetraethoxysilane (tetraethyl orthosilicate; $Si(OEt)_4$ or TEOS), disilane ($Si_2H_6$), $SiH(CH_3)_3$, dimethylsilane ($SiH_2(CH_3)_2$), methylsilane ($SiH_3CH_3$), dichlorosilane ($SiH_2Cl_2$), silicon tetrachloride ($SiCl_4$), silicon tetrafluoride ($SiF_4$), trichlorosilane ($HSiCl_3$), methylsilane ($CH_3SiH_3$), trimethylsilane ($C_3H_{10}Si$), 1,1,3,3-tetramethyldisiloxane (TMDZ), 1,3,5-trisilapentane (TSP), (bis(tertiarybutylamino)silane (BTBAS), (bis(diethylamino)silane (BDEAS), tris(dimethylamino)silane (TDMAS), (Si[N(tBu)CH=CHN(tBu)]

(OEt)$_2$ (Si-TBES), Si[N(tBu)CH=CHN(tBu)](H)NH$_2$ (Si-TBAS), germane (GeH$_4$), germanium tetrachloride (GeCl$_4$), germanium tetrafluoride (GeF$_4$), t-butylgermane (GeH(CH$_3$)$_3$), N$_2$O, O$_2$, NH$_3$, N$_2$, H$_2$, C$_2$H$_2$, or C$_3$H$_6$.

The deposition process may be carried out at temperatures ranging from about −50° C. to about 150° C., including about −50° C., about −45° C., about −40° C., about −35° C., about −30° C., about −25° C., about −20° C., about −15° C., about −10° C., about −5° C., about 0° C., about 5° C., about 10° C., about 15° C., about 20° C., about 25° C., about 30° C., about 35° C., about 40° C., about 45° C., about 50° C., about 55° C., about 60° C., about 65° C., about 70° C., about 75° C., about 80° C., about 85° C., about 90° C., about 95° C., about 100° C., about 105° C., about 110° C., about 115° C., about 120° C., about 125° C., about 130° C., about 135° C., about 140° C., about 145° C., and about 150° C.

The deposition process may be carried out in a process volume at pressures ranging from 0.1 mTorr to 10 Torr, including a pressure of about 0.1 mTorr, about 1 mTorr, about 10 mTorr, about 100 mTorr, about 500 mTorr, about 1 Torr, about 2 Torr, about 3 Torr, about 4 Torr, about 5 Torr, about 6 Torr, about 7 Torr, about 8 Torr, about 9 Torr, and about 10 Torr.

The precursor-containing gas mixture may further include one or more of a dilution gas selected from helium (He), argon (Ar), xenon (Xe), nitrogen (N$_2$), or hydrogen (H$_2$). The dilution gas of some embodiments comprises a compound that is inert gas relative to the reactants and substrate materials.

The precursor-containing gas mixture may further include etchant gases such as Cl$_2$, CF$_4$, or NF$_3$ to improve film quality.

The plasma (e.g., capacitive-coupled plasma) may be formed from either top and bottom electrodes or side electrodes. The electrodes may be formed from a single powered electrode, dual powered electrodes, or more electrodes with multiple frequencies such as, but not limited to, 350 KHz, 2 MHz, 13.56 MHz, 27 MHz, 40 MHz, 60 MHz and 100 MHz, being used alternatively or simultaneously in a CVD system with any or all of the reactant gases listed herein to deposit a thin film of dielectric. In some embodiments, the plasma is a capacitively coupled plasma (CCP). In some embodiments, the plasma is an inductively coupled plasma (ICP). In some embodiments, the plasma is a microwave plasma.

In some embodiments, the dielectric film is deposited in a chamber with the substrate pedestal maintained at 10° C., and the pressure maintained at 2 mTorr, with plasma generated at the wafer level (i.e., a direct plasma) by applying a bias of 2500 Watts (13.56 MHz) to the electrostatic chuck. In some embodiments, an additional RF power of 1000 Watts at 2 MHz was also delivered to the electrostatic chuck, generating a dual-bias plasma at the wafer level.

FIG. 1A depicts a schematic illustration of a substrate processing system 132 that can be used to perform dielectric film deposition in accordance with embodiments described herein. The substrate processing system 132 includes a process chamber 100 coupled to a gas panel 130 and a controller 110. The process chamber 100 generally includes a top wall 124, a sidewall 101 and a bottom wall 122 that define a processing volume 126. A substrate support assembly 146 is provided in the processing volume 126 of the process chamber 100. The substrate support assembly 146 generally includes an electrostatic chuck 150 supported by a stem 160. The electrostatic chuck 150 may be typically fabricated from aluminum, ceramic, and other suitable materials. The electrostatic chuck 150 may be moved in a vertical direction inside the process chamber 100 using a displacement mechanism (not shown).

A vacuum pump 102 is coupled to a port formed in the bottom of the process chamber 100. The vacuum pump 102 is used to maintain a desired gas pressure in the process chamber 100. The vacuum pump 102 also evacuates post-processing gases and by-products of the process from the process chamber 100.

The substrate processing system 132 may further include additional equipment for controlling the chamber pressure, for example, valves (e.g., throttle valves and isolation valves) positioned between the process chamber 100 and the vacuum pump 102 to control the chamber pressure.

A gas distribution assembly 120 having a plurality of apertures 128 is disposed on the top of the process chamber 100 above the electrostatic chuck 150. The apertures 128 of the gas distribution assembly 120 are utilized to introduce process gases into the process chamber 100. The apertures 128 may have different sizes, number, distributions, shape, design, and diameters to facilitate the flow of the various process gases for different process requirements. The gas distribution assembly 120 is connected to the gas panel 130 that allows various gases to supply to the processing volume 126 during processing. A plasma is formed from the process gas mixture exiting the gas distribution assembly 120 to enhance thermal decomposition of the process gases resulting in the deposition of material on a surface 191 of the substrate 190.

The gas distribution assembly 120 and the electrostatic chuck 150 may form a pair of spaced apart electrodes in the processing volume 126. One or more RF power source 140 provide a bias potential through an optional matching network 138 to the gas distribution assembly 120 to facilitate generation of plasma between the gas distribution assembly 120 and the electrostatic chuck 150. Alternatively, the RF power source 140 and the optional matching network 138 may be coupled to the gas distribution assembly 120, the electrostatic chuck 150, or coupled to both the gas distribution assembly 120 and the electrostatic chuck 150, or coupled to an antenna (not shown) disposed exterior to the process chamber 100. In some embodiments, the RF power source 140 may produce power at a frequency of 350 KHz, 2 MHz, 13.56 MHz, 27 MHz, 40 MHz, 60 MHz, or 100 MHz. In one embodiment, the RF power source 140 may provide between about 100 Watts and about 3,000 Watts at a frequency of about 50 kHz to about 13.56 MHz. In another embodiment, the RF power source 140 may provide between about 500 Watts and about 1,800 Watts at a frequency of about 50 kHz to about 13.56 MHz.

The controller 110 includes a central processing unit (CPU) 112, a memory 116, and a support circuit 114 utilized to control the process sequence and regulate the gas flows from the gas panel 130. The central processing unit (CPU) 112 may be of any form of a general-purpose computer processor that may be used in an industrial setting. The software routines can be stored in the memory 116, such as random access memory, read only memory, floppy, or hard disk drive, or other form of digital storage. The support circuit 114 is conventionally coupled to the central processing unit (CPU) 112 and may include cache, clock circuits, input/output systems, power supplies, and the like. Bidirectional communications between the controller 110 and the various components of the substrate processing system 132 are handled through numerous signal cables collectively referred to as signal buses 118, some of which are illustrated in FIG. 1A.

Figure 1B:
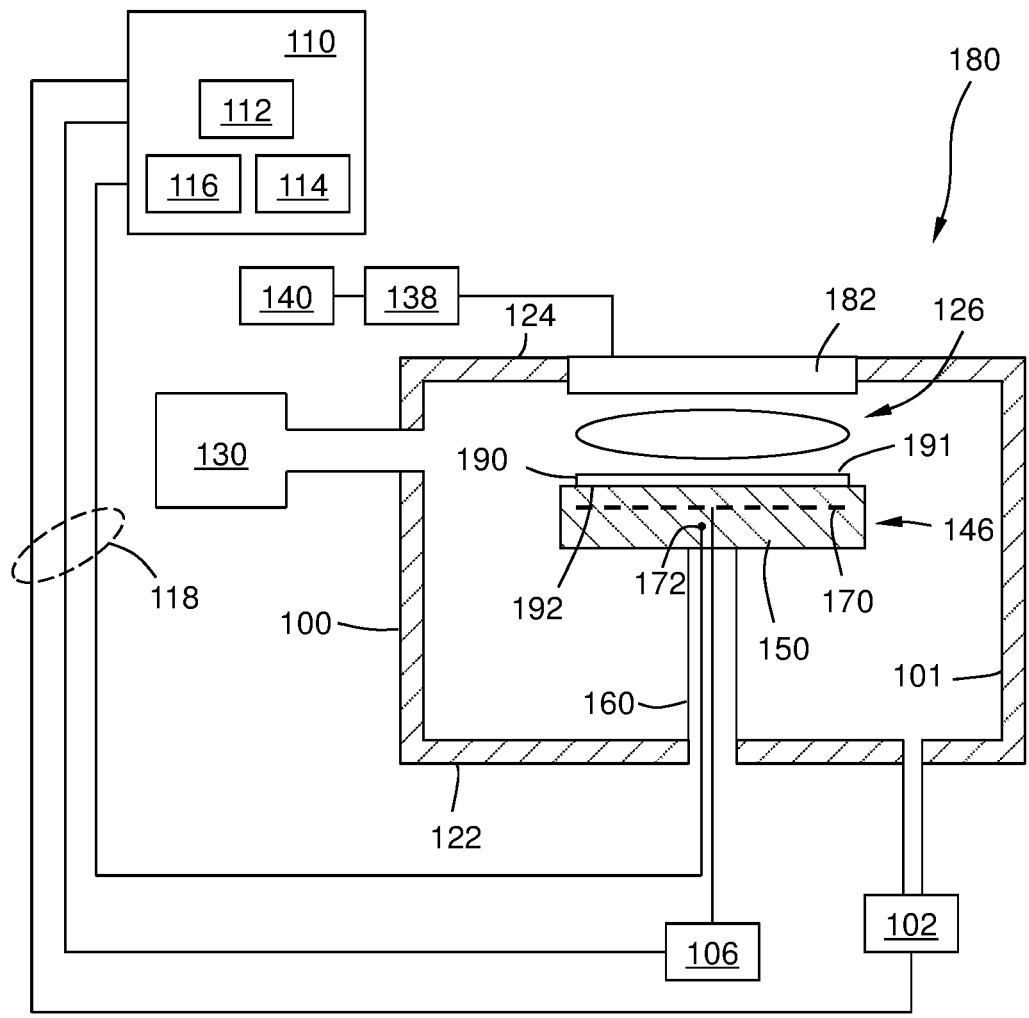
FIG. 1B depicts a schematic cross-sectional view of another deposition system that can be used for the practice of embodiments described herein.

FIG. 1B depicts a schematic cross-sectional view of another substrate processing system 180 that can be used for the practice of embodiments described herein. The substrate processing system 180 is similar to the substrate processing system 132 of FIG. 1A, except that the substrate processing system 180 is configured to flow processing gases from gas panel 130 across the surface 191 of the substrate 190 via the sidewall 101. In addition, the gas distribution assembly 120 depicted in FIG. 1A is replaced with an electrode 182. The electrode 182 may be configured for secondary electron generation. In one embodiment, the electrode 182 is a silicon-containing electrode.

Figure 2:
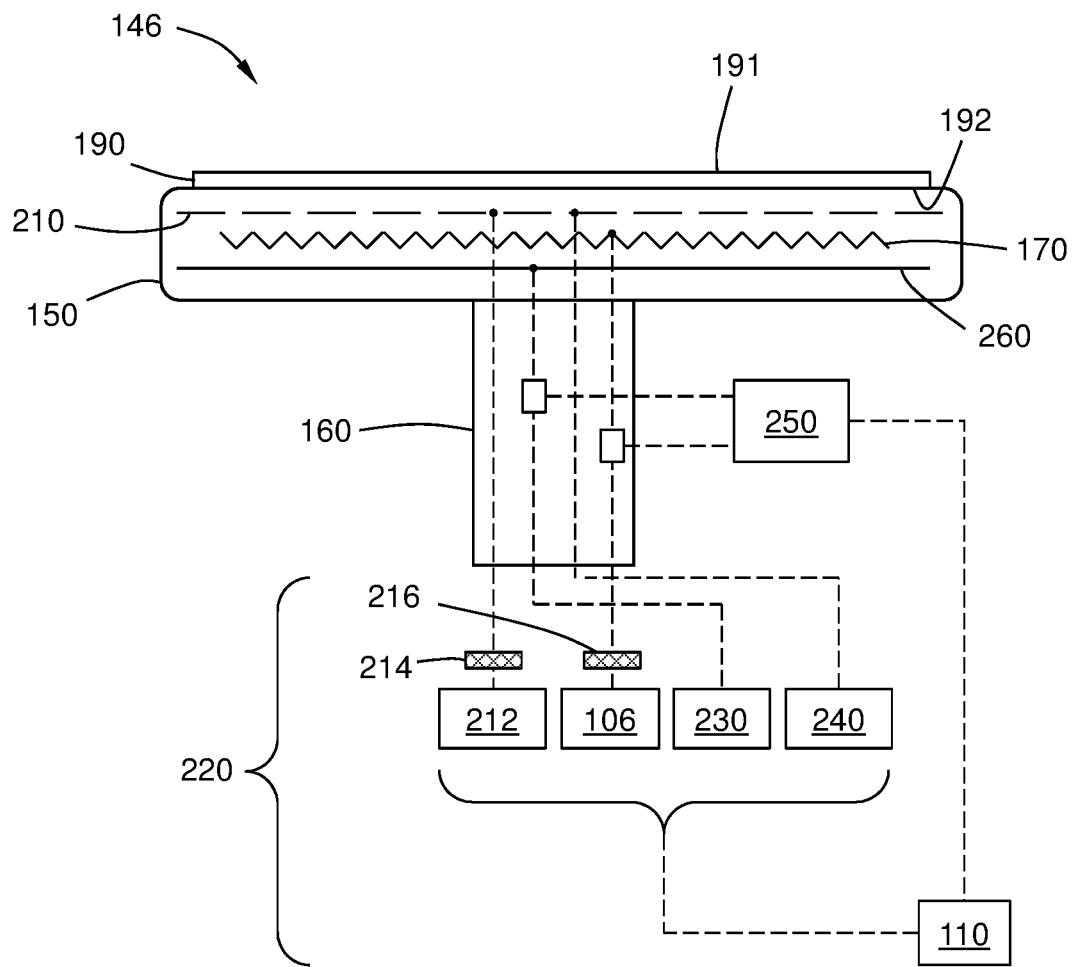
FIG. 2 depicts a schematic cross-sectional view of an electrostatic chuck that may be used in the apparatus of FIG. 1A and FIG. 1B for the practice of embodiments described herein.

FIG. 2 depicts a schematic cross-sectional view of the substrate support assembly 146 used in the processing systems of FIG. 1A and FIG. 1B that can be used for the practice of embodiments described herein. Referring to FIG. 2, the electrostatic chuck 150 may include an embedded heater element 170 suitable for controlling the temperature of a substrate 190 supported on an upper surface 192 of the electrostatic chuck 150. The electrostatic chuck 150 may be resistively heated by applying an electric current from a heater power source 106 to the heater element 170. The heater power source 106 may be coupled through an RF filter 216. The RF filter 216 may be used to protect the heater power source 106 from RF energy. The heater element 170 may be made of a nickel-chromium wire encapsulated in a nickel-iron-chromium alloy (e.g., INCOLOY®) sheath tube. The electric current supplied from the heater power source 106 is regulated by the controller 110 to control the heat generated by the heater element 170, maintaining the substrate 190 and the electrostatic chuck 150 at a substantially constant temperature during film deposition. The supplied electric current may be adjusted to selectively control the temperature of the electrostatic chuck 150 between about −50° C. to about 150° C.

Referring to FIGS. 1A and 1B, a temperature sensor 172, such as a thermocouple, may be embedded in the electrostatic chuck 150 to monitor the temperature of the electrostatic chuck 150 in a conventional manner. The measured temperature is used by the controller 110 to control the power supplied to the heater element 170 to maintain the substrate at a desired temperature.

Referring to FIG. 2, the electrostatic chuck 150 includes a chucking electrode 210, which may be a mesh of a conductive material. The chucking electrode 210 may be embedded in the electrostatic chuck 150. The chucking electrode 210 is coupled to a chucking power source 212 that, when energized, electrostatically clamps the substrate 190 to the upper surface 192 of the electrostatic chuck 150.

The chucking electrode 210 may be configured as a monopolar or bipolar electrode, or have another suitable arrangement. The chucking electrode 210 may be coupled through an RF filter 214 to the chucking power source 212, which provides direct current (DC) power to electrostatically secure the substrate 190 to the upper surface 192 of the electrostatic chuck 150. The RF filter 214 prevents RF power utilized to form plasma within the process chamber 100 from damaging electrical equipment or presenting an electrical hazard outside the chamber. The electrostatic chuck 150 may be fabricated from a ceramic material, such as AlN or $Al_2O_3$. Alternatively, the electrostatic chuck 150 may be fabricated from a polymer, such as polyimide, polyetheretherketone (PEEK), polyaryletherketone (PAEK), and the like.

A power application system 220 is coupled to the substrate support assembly 146. The power application system 220 may include the heater power source 106, the chucking power source 212, a first radio frequency (RF) power source 230, and a second RF power source 240. Embodiments of the power application system 220 may additionally include the controller 110, and a sensor device 250 that is in communication with the controller 110 and both of the first radio frequency (RF) power source 230 and the second RF power source 240.

The controller 110 may also be utilized to control the plasma from the processing gas by application of RF power from the first radio frequency (RF) power source 230 and the second RF power source 240 in order to deposit a layer of material on the substrate 190.

As described above, the electrostatic chuck 150 includes the chucking electrode 210 that may function in one aspect to chuck the substrate 190 while also functioning as a first RF electrode. The electrostatic chuck 150 may also include a second RF electrode 260, and together with the chucking electrode 210, may apply RF power to tune the plasma. The first radio frequency (RF) power source 230 may be coupled to the second RF electrode 260 while the second RF power source 240 may be coupled to the chucking electrode 210. A first matching network and a second matching network may be provided for the first radio frequency (RF) power source 230 and the second RF power source 240, respectively. The second RF electrode 260 may be a solid metal plate of a conductive material as shown. Alternatively, the second RF electrode 260 may be a mesh of conductive material.

The first radio frequency (RF) power source 230 and the second RF power source 240 may produce power at the same frequency or a different frequency. In some embodiments, one or both of the first radio frequency (RF) power source 230 and the second RF power source 240 may independently produce power at a frequency in a range from about 350 KHz to about 100 MHz, including, but not limited to, 350 KHz, 2 MHz, 13.56 MHz, 27 MHz, 40 MHz, 60 MHz, or 100 MHz. In some embodiments, the first radio frequency (RF) power source 230 may produce power at a frequency of 13.56 MHz and the second RF power source 240 may produce power at a frequency of 2 MHz, or vice versa. RF power from one or both of the first radio frequency (RF) power source 230 and second RF power source 240 may be varied in order to tune the plasma. For example, the sensor device 250 may be used to monitor the RF energy from one or both of the first radio frequency (RF) power source 230 and the second RF power source 240. Data from the sensor device 250 may be communicated to the controller 110, and the controller 110 may be utilized to vary power applied by the first radio frequency (RF) power source 230 and the second RF power source 240.

In general, the following exemplary deposition process parameters may be used to form the as-deposited dielectric film. The wafer temperature may range from about −50° C. to about 150° C., including, but not limited to from about 10° C. to about 100° C., or from about 10° C. to about 50° C. The chamber pressure may range from a chamber pressure in a range of about 0.1 mTorr to about 10 Torr, including, but not limited to, from about 2 mTorr to about 50 mTorr, or from about 2 mTorr to about 10 mTorr. The flow rate of the precursor-containing gas mixture may be in a range from about 10 sccm to about 1,000 sccm, including, but not limited to, from about 100 sccm to about 200 sccm, or from about 150 sccm to about 200 sccm. The flow rate of a dilution gas may individually range from about 50 sccm to about 50,000 sccm, including, but not limited to, from about 50 sccm to about 1000 sccm, or from about 50 sccm to about 100 sccm.

The dielectric film may be deposited to a thickness in a range of about 5 Å to about 60,000 Å, including a range of about 300 Å to about 10,000 Å, a range of about 2000 Å to about 3000 Å, or a range of about 5 Å to about 200 Å.

The as-deposited dielectric film may have a refractive index or n-value (n (at 633 nm)) greater than about 1.5, for example, about 1.6 to about 3.0, including about 1.5, about 1.6, about 1.7, about 1.8, about 1.9, about 2.0, about 2.1, about 2.2, about 2.3, abut 2.4, about 2.5, about 2.6, about 2.7, about 2.8, about 2.9, or about 3.0. In one or more embodiments, the film is silicon oxide and the refractive index is about 1.5. In a further embodiment, the film is silicon nitride and the refractive index is about 1.9 to about 2.0. The methods of one or more embodiments advantageously enable the fabrication of high quality films and low temperature, which have properties similar to or improved over films prepared by high temperature CVD or high temperature PECVD. The as-deposited dielectric film may have an extinction coefficient or k-value (k (at 633 nm)) greater than 0.1, for example, about 0.2 to about 0.3, including about 0.2, about 0.21, about 0.22, about 0.23, about 0.24, about 0.25, about 0.26, about 0.27, about 0.28, about 0.29, about 0.30. The as-deposited dielectric film may have a stress (MPa) less than about −300 MPa, for example from about −600 MPa to about −300 MPa, from about −600 MPa to about −500 MPa, including about −600 MPa, about −575 MPa, about −550 MPa, about −525 MPa, about −500 mPa, about −475 MPa, about −450 MPa, about −425 MPa, about −400 MPa, about −375 MPa, about −350 MPa, about −325 MPa, or about −300 MPa.

In one or more embodiments, the density of the dielectric film is greater than 1.8 g/cc, including greater than 1.9 g/cc, and including greater than 2.0 g/cc. In one or more embodiments, the density of the dielectric film is about 2.1 g/cc. In one or more embodiments, the density of the dielectric film is in a range of about greater than 1.8 g/cc to about 2.2 g/cc. In one or more embodiments, the density of the dielectric film is greater than about 2.2 g/cc.

Another advantage of the method of one or more embodiments is that a lower temperature process may be used to produce a dielectric film with the desired density and transparency. Ordinarily, higher substrate temperature during deposition is the process parameter used to encourage the formation of a higher density film. When the precursors and the method of one or more embodiments are used together, surprisingly the substrate temperature may be reduced during deposition, for example to as low as about less than −40° C., and less than about 0° C., less than about 10° C., less than about room temperature, or less than about 22° C. to about 26° C., and still produce a film of the desired density, i.e., a dielectric film with a density greater than about 1.8 g/cc, including greater than about 1.9 g/cc, and including greater than about 2.0 g/cc. Hence, the method of one or more embodiments may produce a relatively high density film, particularly a high-density carbon film, with an absorption coefficient as low as about 0.04.

Figure 3:
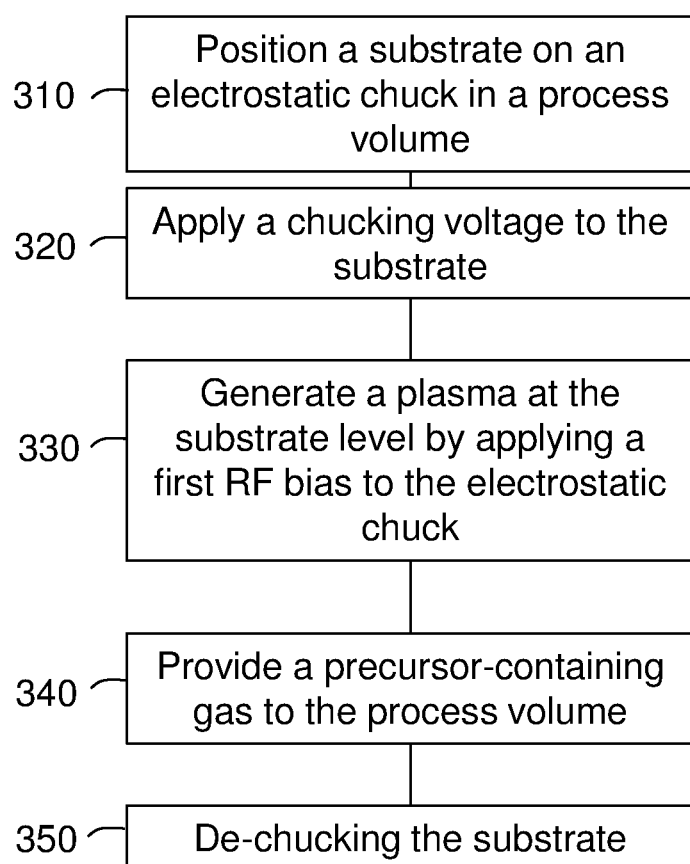
FIG. 3 depicts a flow diagram of a method for forming a dielectric film on a substrate in accordance with one or more embodiments.

FIG. 3 depicts a flow diagram of a method 300 for forming a dielectric film on a film stack disposed on a substrate in accordance with one embodiment of the present disclosure. The dielectric film formed on a film stack may be utilized, for example, as an insulating layer in the film stack.

Figure 4A:
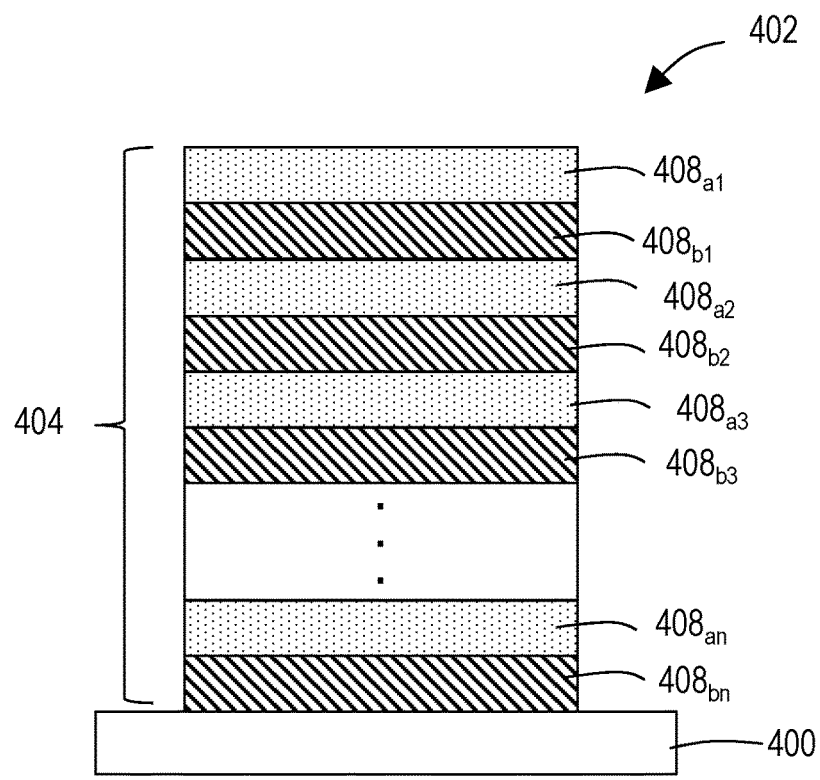
FIGS. 4A-4B depict one embodiment of a sequence for forming a dielectric film on a film stack formed on a substrate in accordance with one or more embodiments
Figure 4B:
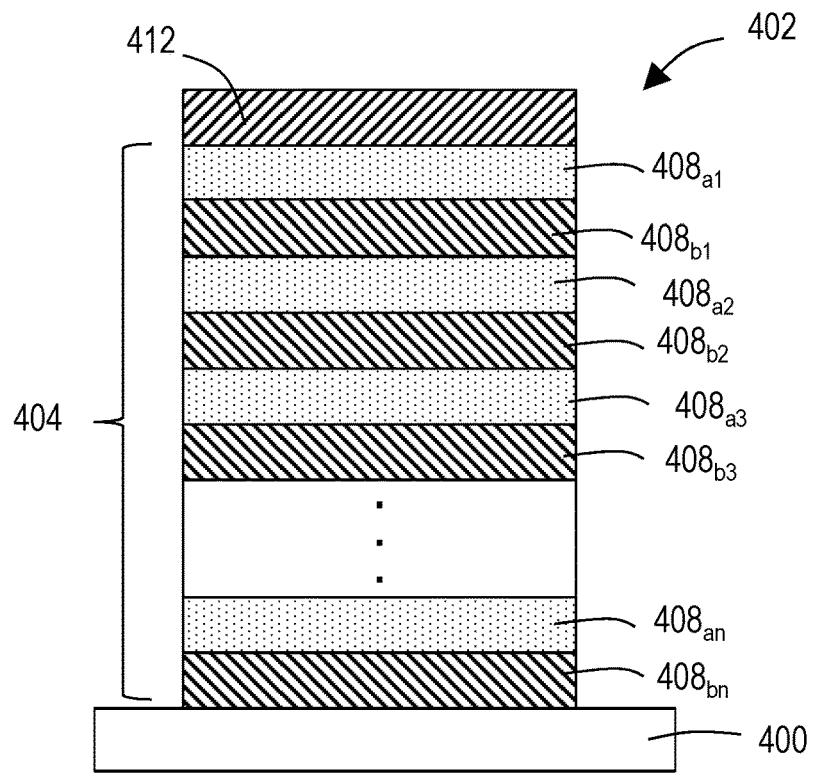

FIGS. 4A-4B are schematic cross-sectional views illustrating a sequence for forming a dielectric film on a film stack disposed on a substrate according to the method 300. Although the method 300 is described below with reference to a dielectric layer that may be formed on a film stack utilized to manufacture stair-like structures in the film stack for three dimensional semiconductor devices, the method 300 may also be used to advantage in other device manufacturing applications. Further, it should also be understood that the operations depicted in FIG. 3 may be performed simultaneously and/or in a different order than the order depicted in FIG. 3.

The method 300 begins at operation 310 by positioning a substrate, such as a substrate 400 depicted in FIG. 4A, into a process chamber, such as the process chamber 100 depicted in FIG. 1A or FIG. 1B. The substrate 400 may be substrate 190 depicted in FIG. 1A, FIG. 1B, and FIG. 2. The substrate 400 may be positioned on an electrostatic chuck, for example, the upper surface 192 of the electrostatic chuck 150. The substrate 400 may be a silicon-based material or any suitable insulating material or conductive material as needed, having a film stack 404 disposed on the substrate 400 that may be utilized to form a structure 402, such as stair-like structures, in the film stack 404.

As shown in the exemplary embodiment depicted in FIG. 4A, the substrate 400 may have a substantially planar surface, an uneven surface, or a substantially planar surface having a structure formed thereon. The film stack 404 is formed on the substrate 400. In one embodiment, the film stack 404 may be utilized to form a gate structure, a contact structure or an interconnection structure in a front end or back end process. The method 300 may be performed on the film stack 404 to form the stair-like structures therein used in a memory structure, such as NAND structure. In one embodiment, the substrate 400 may be a material such as crystalline silicon (e.g., Si(100) or Si(111)), silicon oxide, strained silicon, silicon germanium, doped or undoped polysilicon, doped or undoped silicon substrates and patterned or non-patterned substrates silicon on insulator (SOI), carbon doped silicon oxides, silicon nitride, doped silicon, germanium, gallium arsenide, glass, sapphire. The substrate 400 may have various dimensions, such as 200 mm, 300 mm, and 450 mm, or other diameter substrates, as well as, rectangular or square panels. Unless otherwise noted, embodiments and examples described herein are conducted on substrates with a 200 mm diameter, a 300 mm diameter, or a 450 mm diameter substrate. In the embodiment wherein a SOI structure is utilized for the substrate 400, the substrate 400 may include a buried dielectric layer disposed on a silicon crystalline substrate. In the embodiment depicted herein, the substrate 400 may be a crystalline silicon substrate.

In one embodiment, the film stack 404 disposed on the substrate 400 may have a number of vertically stacked layers. The film stack 404 may comprise pairs including a first layer (shown as $408_{a1}$, $408_{a2}$, $408_{a3}$, . . . , $408_{an}$) and a second layer (shown as $408_{b1}$, $408_{b2}$, $408_{b3}$, . . . , $408_{bn}$) repeatedly formed in the film stack 404. The pairs includes alternating first layer (shown as $408_{a1}$, $408_{a2}$, $408_{a3}$, . . . , $408_{an}$) and second layer (shown as $408_{b1}$, $408_{b2}$, $408_{b3}$, . . . , $408_{bn}$) repeatedly formed until a predetermined number of pairs of the first layers and the second layers are reached.

The film stack 404 may be a part of a semiconductor chip, such as a three-dimensional memory chip. Although three repeating layers of first layers (shown as $408_{a1}$, $408_{a2}$, $408_{a3}$, . . . , $408_{an}$) and second layers (shown as $408_{b1}$, $408_{b2}$, $408_{b3}$, . . . , $408_{bn}$) are shown in FIGS. 4A-4B, it is noted that any desired number of repeating pairs of the first and the second layers may be utilized as needed.

In one embodiment, the film stack 404 may be utilized to form multiple gate structures for a three-dimensional memory chip. The first layers $408_{a1}$, $408_{a2}$, $408_{a3}$, . . . , $408_{an}$, formed in the film stack 404 may be a first dielectric layer according to one or more embodiments and the second layers $408_{b1}$, $408_{b2}$, $408_{b3}$, ..., $408_{bn}$ may be a second dielectric layer according to one or more embodiments. Suitable dielectric films according to one or more embodiments may be utilized to form the first layers $408_{a1}$, $408_{a2}$, $408_{a3}$, ..., $408_{an}$ and/or the second layers $408_{b1}$, $408_{b2}$, $408_{b3}$, ..., $408_{bn}$ including, but not limited to, one or more of silicon, silicon nitride, silicon carbide, silicon oxide, silicon oxycarbide, silicon oxycarbonitride, silicon oxynitride, titanium nitride, or composite of oxide and nitride, at least one or more oxide layers sandwiching a nitride layer, and combinations thereof, among others.

In some embodiments, the dielectric layers may be a high-K material having a dielectric constant greater than 4. Suitable examples of the high-K materials include, but are not limited to, hafnium dioxide ($HfO_2$), zirconium dioxide ($ZrO_2$), hafnium silicon oxide ($HfSiO_2$), hafnium aluminum oxide (HfAlO), zirconium silicon oxide ($ZrSiO_2$), tantalum dioxide ($TaO_2$), aluminum oxide, aluminum doped hafnium dioxide, bismuth strontium titanium (BST), and platinum zirconium titanium (PZT), among others.

In one particular example, the first layers $408_{a1}$, $408_{a2}$, $408_{a3}$, ..., $408_{an}$ are silicon oxide layers and the second layers $408_{b1}$, $408_{b2}$, $408_{b3}$, ..., $408_{bn}$ are silicon nitride layers or polysilicon layers disposed on the first layers $408_{a1}$, $408_{a2}$, $408_{a3}$, ..., $408_{an}$. In one embodiment, the thickness of first layers $408_{a1}$, $408_{a2}$, $408_{a3}$, ..., $408_{an}$ may be controlled at between about 50 Å and about 1000 Å, such as about 500 Å, and the thickness of the each second layers $408_{b1}$, $408_{b2}$, $408_{b3}$, ..., $408_{bn}$ may be controlled at between about 50 Å and about 1000 Å, such as about 500 Å. The film stack 404 may have a total thickness between about 100 Å and about 2000 Å. In one embodiment, a total thickness of the film stack 404 is about 3 microns to about 10 microns and will vary as technology advances.

The dielectric film of one or more embodiments may be formed on any surfaces or any portion of the substrate 400 with or without the film stack 404 present on the substrate 400.

At operation 320, a chucking voltage is applied to the electrostatic chuck to clamp the substrate 400 to the electrostatic chuck. In some embodiments, where the substrate 400 is positioned on the upper surface 192 of the electrostatic chuck 150, the upper surface 192 provides support and clamps the substrate 400 during processing. The electrostatic chuck 150 flattens the substrate 400 closely against the upper surface 192, preventing backside deposition. An electrical bias is provided to the substrate 400 via chucking electrode 210. The chucking electrode 210 may be in electronic communication with the chucking power source 212 that supplies a biasing voltage to the chucking electrode 210. In one embodiment, the chucking voltage is between about 10 volts and about 3000 volts. In one embodiment, the chucking voltage is between about 100 volts and about 2000 volts. In one embodiment, the chucking voltage is between about 200 volts and about 1000 volts.

During operation 320, several process parameters may be regulated. In one embodiment suitable for processing a 300 mm substrate, the process pressure in the processing volume may be maintained at about 0.1 mTorr to about 10 Torr, including about 2 mTorr to about 50 mTorr, or about 5 mTorr to about 20 mTorr. In one embodiment suitable for processing a 300 mm substrate, the processing temperature and/or substrate temperature may be maintained at about −50° C. to about 250° C., including about 0° C. to about 50° C.; or about 10° C. to about 20° C.

In one embodiment, a constant chucking voltage is applied to the substrate 400. In one embodiment, the chucking voltage may be pulsed to the electrostatic chuck 150. In some embodiments, a backside gas may be applied to the substrate 400 while applying the chucking voltage to control the temperature of the substrate. Backside gases may include but are not limited to, helium (He), argon (Ar), or the like.

At operation 330, a plasma is generated at the substrate level by applying a first RF bias to the electrostatic chuck. Plasma generated at the substrate level may be generated in a plasma region between the substrate and the electrostatic chuck. The first RF bias may be from about 10 Watts and about 3000 Watts at a frequency in a range of from about 350 KHz to about 100 MHz, including, but not limited to, 350 KHz, 2 MHz, 13.56 MHz, 27 MHz, 40 MHz, 60 MHz, or 100 MHz. In one embodiment, the first RF bias is provided at a power between about 2500 Watts and about 3000 Watts at a frequency of about 13.56 MHz. In one embodiment, the first RF bias is provided to the electrostatic chuck 150 via the second RF electrode 260. The second RF electrode 260 may be in electronic communication with the first radio frequency (RF) power source 230 that supplies a biasing voltage to the second RF electrode 260. In one embodiment, the bias power is between about 10 Watts and about 3000 Watts. In one embodiment, the bias power is between about 2000 Watts and about 3000 Watts. In one embodiment, the bias power is between about 2500 Watts and about 3000 Watts. The first radio frequency (RF) power source 230 may produce power at a frequency in a range of from about 350 KHz to about 100 MHz, including, but not limited to, 350 KHz, 2 MHz, 13.56 MHz, 27 MHz, 40 MHz, 60 MHz, or 100 MHz.

In some embodiments, operation 330 further comprises applying a second RF bias to the electrostatic chuck. The second RF bias may be from about 10 Watts and about 3000 Watts at a frequency in a range of from about 350 KHz to about 100 MHz, including, but not limited to, 350 KHz, 2 MHz, 13.56 MHz, 27 MHz, 40 MHz, 60 MHz, or 100 MHz. In one embodiment, the second RF bias is provided at a power between about 800 Watts and about 1200 Watts at a frequency of about 2 MHz. In one embodiment, the second RF bias is provided to the substrate 400 via the chucking electrode 210. The chucking electrode 210 may be in electronic communication with second RF power source 240 that supplies a biasing voltage to the chucking electrode 210. In one embodiment, the bias power is between about 10 Watts and about 3000 Watts. In one embodiment, the bias power is between about 500 Watts and about 1500 Watts. In one embodiment, the bias power is between about 800 Watts and about 1200 Watts. The second RF power source 240 may produce power at a frequency in a range of from about 350 KHz to about 100 MHz, including, but not limited to, 350 KHz, 2 MHz, 13.56 MHz, 27 MHz, 40 MHz, 60 MHz, or 100 MHz. In one embodiment, the chucking voltage supplied in operation 320 is maintained during operation 330.

In some embodiments, during operation 330, the first RF bias is provided to the substrate 400 via the chucking electrode 210 and the second RF bias may be provided to the substrate 400 via the second RF electrode 260. In one embodiment, the first RF bias is about 2500 Watts (13.56 MHz) and the second RF bias is about 1000 Watts (2 MHz).

During operation 340, a precursor-containing gas mixture is flowed into the processing volume 126 to form the dielectric film on the film stack. The precursor-containing gas mixture may be flowed from the gas panel 130 into the processing volume 126 either through the gas distribution assembly 120 or via the sidewall 101. The precursor-containing gas mixture may include one or more precursor as described herein. The precursor-containing gas mixture may further include an inert gas, a dilution gas, a nitrogen-containing gas, an etchant gas, or combinations thereof. The precursor can be liquid or gas, though the preferred precursor would be vapor at room temperature to simplify the hardware needed for material metering, control and delivery to the chamber. In some embodiments, the chucking voltage supplied during operation 320 is maintained during operation 340. In some embodiments, the process conditions established during operation 320 and plasma formed during operation 330 are maintained during operation 340.

In some embodiments, the precursor-containing gas mixture further comprises one or more dilution gases. Suitable dilution gases such as helium (He), argon (Ar), xenon (Xe), hydrogen ($H_2$), nitrogen ($N_2$), ammonia ($NH_3$), or combinations thereof, among others, may be added to the gas mixture, if desired. Argon (Ar), helium (He), and nitrogen ($N_2$) are used to control the density and deposition rate of the dielectric film. In some cases, the addition of $N_2$ and/or $NH_3$ can be used to control the hydrogen ratio of the dielectric film, as discussed below. Alternatively, dilution gases may not be used during the deposition.

In some embodiments, the precursor-containing gas mixture further comprises one or more nitrogen-containing gases. Suitable nitrogen-containing compounds include, for example, pyridine, aliphatic amine, amines, nitriles, ammonia and similar compounds.

In some embodiments, the precursor-containing gas mixture further comprises an inert gas. In some embodiments, an inert gas, such as argon (Ar) and/or helium (He) may be supplied with the precursor-containing gas mixture into the processing volume 126. Other inert gases, such as nitrogen ($N_2$) and nitric oxide (NO), may also be used to control the density and deposition rate of the dielectric film. Additionally, a variety of other processing gases may be added to the precursor-containing gas mixture to modify properties of the dielectric film material. In one embodiment, the other processing gases may be reactive gases, such as hydrogen ($H_2$), ammonia ($NH_3$), a mixture of hydrogen ($H_2$) and nitrogen ($N_2$), or combinations thereof. The addition of $H_2$ and/or $NH_3$ may be used to control the hydrogen ratio of the deposited dielectric film. The hydrogen ratio present in the dielectric film provides control over layer properties, such as reflectivity.

In some embodiments, the precursor-containing gas mixture further comprises an etchant gas. Suitable etchant gases include chlorine ($Cl_2$), carbon tetrafluoride ($CF_4$), nitrogen trifluoride ($NF_3$), or combinations thereof.

In some embodiments, after the dielectric film 412 is formed on the substrate during operation 340, the dielectric film 412 is exposed to hydrogen radicals. In some embodiments, the dielectric film 412 is exposed to hydrogen radicals during the deposition process of operation 340. In some embodiments, the hydrogen radicals are formed in an RPS and are delivered to the processing region.

At operation 350, after the dielectric film 412 is formed on the substrate, the substrate is de-chucked. During operation 350, the chucking voltage is turned-off. The reactive gases are turned-off and optionally purged from the processing chamber. In one embodiment, during operation 350 RF power is reduced (e.g., ~200 W). Optionally, the controller 110 monitors impedance change to determine whether electrostatic charges are dissipated to ground through the RF path. Once the substrate is de-chucked from the electrostatic chuck, the remaining gases are purged from the processing chamber. The processing chamber is pumped down and the substrate is moved up on the lift pins and transferred out of the chamber.

After the dielectric film 412 is formed on the substrate, the dielectric film 412 may be utilized in an etching process as a patterning mask to form a three-dimensional structure, such as a stair like structure. The dielectric film 412 may be patterned using a standard photoresist patterning technique. A patterned photoresist (not shown) may be formed over the dielectric film 412. The dielectric film 412 may be etched in a pattern corresponding with the patterned photoresist layer followed by etching the pattern into the substrate 400. Material may be deposited into the etched portions of the dielectric film 412. The dielectric film 412 may be removed using a solution comprising hydrogen peroxide and sulfuric acid. One exemplary solution comprising hydrogen peroxide and sulfuric acid is known as Piranha solution or Piranha etch. The dielectric film 412 may also be removed using etch chemistries containing oxygen and halogens, including, but not limited to, chlorine (Cl), fluorine (F), iodine (I), bromine (Br), and astatine (At). For example, the dielectric film 412 may be removed using etch chemistries containing $Cl_2/O_2$, $CF_4/O_2$, or $Cl_2/O_2/CF_4$. The dielectric film 412 may be removed by a chemical mechanical polishing (CMP) process.

Processes may generally be stored in the memory as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

The disclosure is now described with reference to the following examples. Before describing several exemplary embodiments of the disclosure, it is to be understood that the disclosure is not limited to the details of construction or process steps set forth in the following description. The disclosure is capable of other embodiments and of being practiced or being carried out in various ways.

EXAMPLES

Example 1

A low temperature, high quality silicon nitride dielectric film was fabricated by flowing 30 sccm $SiH_4$, 100 sccm $NH_3$, and $N_2$ as process gases at a temperature of 100° C., pressure of 400 mTorr, applying 200 Watts RF (13.56 MHz) power through the substrate pedestal (electrostatic chuck) in a CVD reactor with Ar (g) and He (g) as the diluting gases. The resultant dielectric film had a refractive index (RI) of 1.82 (633 nm), which is much higher than a dielectric film formed from PECVD at the same temperature. The RI was improved by tuning power (higher) and pressure (lower). The primary and secondary RF could be any combination of 350 KHz, 2 MHz, 13.56 MHz, 27 MHz, 40 MHz, 60 MHz, 100 MHz.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of processing a substrate, the method comprising:
   flowing a precursor-containing gas mixture into a processing volume of a processing chamber having a substrate positioned on an electrostatic chuck,
   maintaining the substrate at a pressure in a range of about 0.1 mTorr and about 10 Torr and at a temperature in a range of about −50° C. to about 150° C.; and
   generating a plasma at a substrate level by applying a first RF bias to the electrostatic chuck to deposit a dielectric film on the substrate, the dielectric film having a refractive index in a range of about 1.5 to about 3 at 633 nm.

2. The method of claim 1, further comprising applying a chucking voltage to the substrate positioned on the electrostatic chuck.

3. The method of claim 1, wherein the precursor-containing gas mixture comprises one or more precursor selected from silane ($SiH_4$), triethoxysilane ($SiH(OEt)_3$), tetraethoxysilane (tetraethyl orthosilicate; $Si(OEt)_4$ or TEOS), disilane ($Si_2H_6$), $SiH(CH_3)_3$, dimethylsilane ($SiH_2(CH_3)_2$), methylsilane ($SiH_3CH_3$), dichlorosilane ($SiH_2Cl_2$), silicon tetrachloride ($SiCl_4$), silicon tetrafluoride ($SiF_4$), trichlorosilane ($HSiCl_3$), methylsilane ($CH_3SiH_3$), trimethylsilane ($C_3H_{10}Si$), 1,1,3,3-tetramethyldisiloxane (TMDZ), 1,3,5-trisilapentane (TSP), (bis(tertiarybutylamino)silane (BTBAS), (bis(diethylamino)silane (BDEAS), tris(dimethylamino)silane (TDMAS), (Si[N(tBu)CH=CHN(tBu)](OEt)$_2$ (Si-TBES), Si[N(tBu)CH=CHN(tB u)](H)NH$_2$ (Si-TBAS), germane ($GeH_4$), germanium tetrachloride ($GeCl_4$), germanium tetrafluoride ($GeF_4$), t-butylgermane ($GeH(CH_3)_3$), $N_2O$, $O_2$, $NH_3$, $N_2$, $H_2$, $C_2H_2$, or $C_3H_6$.

4. The method of claim 1, wherein the precursor-containing gas mixture comprises one or more dilution gas selected from helium (He), argon (Ar), xenon (Xe), krypton (Kr), nitrogen ($N_2$), or hydrogen ($H_2$).

5. The method of claim 1, wherein the dielectric film comprises one or more of silicon, silicon nitride, silicon carbide, silicon oxide, silicon oxycarbide, silicon oxycarbonitride, silicon oxynitride, titanium nitride, or composite of oxide and nitride.

6. The method of claim 1, wherein the dielectric film has a density greater than about 1.8 g/cc.

7. The method of claim 1, wherein the first RF bias is provided at a power in a range of about 10 Watts to about 3000 Watts and at a frequency in a range of about 350 KHz to about 100 MHz.

8. The method of claim 7, wherein the first RF bias is provided at a power in a range of about 2500 Watts to about 3000 Watts at a frequency of about 13.56 MHz.

9. The method of claim 1, further comprising applying a second RF bias to the electrostatic chuck to generate the plasma at the substrate level.

10. The method of claim 9, wherein the second RF bias is provided at a power in a range of about 10 Watts to about 3000 Watts and at a frequency in a range of about 350 KHz to about 100 MHz.

11. The method of claim 10, wherein the second RF bias is provided at a power in a range of about 800 Watts to about 1200 Watts at a frequency of about 2 MHz.

12. The method of claim 1, further comprising forming a patterned photoresist layer over the dielectric film.

13. The method of claim 12, further comprising etching the dielectric film in a pattern corresponding with the patterned photoresist layer to provide etched portions of the dielectric film.

14. The method of claim 13, further comprising etching the pattern into the substrate.

15. The method of claim 14, further comprising depositing a material into the etched portions of the dielectric film.

16. A method of processing a substrate, the method comprising:
   flowing a precursor-containing gas mixture into a processing volume of a processing chamber having as substrate positioned on an electrostatic chuck, wherein the precursor-containing gas mixture comprises one or more precursor selected from silane ($SiH_4$), triethoxysilane ($SiH(OEt)_3$), tetraethoxysilane (tetraethyl orthosilicate; $Si(OEt)_4$ or TEOS), disilane ($Si_2H_6$), $SiH(CH_3)_3$, dimethylsilane ($SiH_2(CH_3)_2$), methylsilane ($SiH_3CH_3$), dichlorosilane ($SiH_2Cl_2$), silicon tetrachloride ($SiCl_4$), silicon tetrafluoride ($SiF_4$), trichlorosilane ($HSiCl_3$), methylsilane ($CH_3SiH_3$), trimethylsilane ($C_3H_{10}Si$), 1,1,3,3-tetramethyldisiloxane (TMDZ), 1,3,5-trisilapentane (TSP), (bis(tertiarybutylamino)silane (BTBAS), (bis(diethylamino)silane (BDEAS), tris(dimethylamino)silane (TDMAS), (Si[N(tBu)CH=CHN(tBu)](OEt)$_2$ (Si-TBES), Si[N(tBu)CH=CHN(tB u)]

(H)NH$_2$ (Si-TBAS), germane (GeH$_4$), germanium tetrachloride (GeCl$_4$), germanium tetrafluoride (GeF$_4$), t-butylgermane (GeH(CH$_3$)$_3$), N$_2$O, O$_2$, NH$_3$, N$_2$, H$_2$, C$_2$H$_2$, or C$_3$H$_6$;

maintaining the substrate at a pressure in a range of about 0.1 mTorr to about 10 Torr; and generating a plasma at a substrate level by applying a first RF bias and a second RF bias to the electrostatic chuck to deposit a dielectric film on the substrate, the dielectric film having a refractive index in a range of about 1.5 to about 3 at 633 nm.

17. The method of claim 16, wherein the first RF bias is provided at a power in a range of about 2500 Watts to about 3000 Watts at a frequency of about 13.56 MHz.

18. The method of claim 16, wherein the second RF bias is provided at a power in a range of about 800 Watts to about 1200 Watts at a frequency of about 2 MHz.

19. The method of claim 16, further comprising applying a chucking voltage to the substrate positioned on the electrostatic chuck.

20. The method of claim 16, further comprising:
forming a patterned photoresist layer over the dielectric film;
etching the dielectric film in a pattern corresponding with the patterned photoresist layer to provide etched portions of the dielectric film;
etching the pattern into the substrate; and
depositing a material into the etched portions of the dielectric film.

* * * * *